United States Patent

Goeschel et al.

Patent Number: 5,283,467
Date of Patent: Feb. 1, 1994

[54] HEAT SINK MOUNTING SYSTEM FOR SEMICONDUCTOR DEVICES

[75] Inventors: Frederick G. Goeschel, Mt. Clemens; Mark L. Lanting, Portage; Arden M. McConnell, Dearborn, all of Mich.

[73] Assignee: Eaton Corporation, Cleveland, Ohio

[21] Appl. No.: 894,678

[22] Filed: Jun. 5, 1992

[51] Int. Cl.⁵ .......................................... H01L 23/02
[52] U.S. Cl. .................................. 257/718; 257/719; 257/722; 361/704; 361/707; 165/80.3; 174/16.3
[58] Field of Search ................ 165/104.33, 80.3; 361/386, 388; 257/718, 719, 721, 722; 174/16.3

[56] References Cited

U.S. PATENT DOCUMENTS

| | | | |
|---|---|---|---|
| 3,911,327 | 10/1975 | Murari et al. | 257/719 |
| 3,946,276 | 3/1976 | Braun et al. | 257/719 |
| 3,972,012 | 7/1976 | Liu | 257/719 |
| 4,153,107 | 5/1979 | Antonetti et al. | 165/185 |
| 4,246,597 | 1/1981 | Cole et al. | 357/81 |
| 4,254,431 | 3/1981 | Babuka et al. | 357/82 |
| 4,462,462 | 7/1984 | Meagher et al. | 165/80 |
| 4,504,886 | 3/1985 | Cygan et al. | 361/386 |
| 4,509,839 | 4/1985 | Lavochkin | 357/81 |
| 4,707,726 | 11/1987 | Tinder | 357/81 |
| 4,724,514 | 2/1988 | Kaufman | 361/386 |
| 4,731,693 | 3/1988 | Berg et al. | 257/718 |
| 4,748,495 | 5/1988 | Kucharek | 257/719 |
| 4,933,746 | 6/1990 | King | 357/81 |
| 5,019,942 | 5/1991 | Clemens | 361/388 |
| 5,065,279 | 11/1991 | Lazenby et al. | 257/719 |

Primary Examiner—William Mintel
Assistant Examiner—David Ostrowski
Attorney, Agent, or Firm—L. H. Uthoff, Jr.

[57] ABSTRACT

A method of mounting a semiconductor device to a heat sink where an opening in the circuit board is formed and sized to allow the semiconductor device to pass therethrough, where a heat sink is positioned on one side of the circuit board and a load is introduced on a second side of the circuit board and applied to the semiconductor device forcing it against the heat sink.

8 Claims, 3 Drawing Sheets

FIG 4
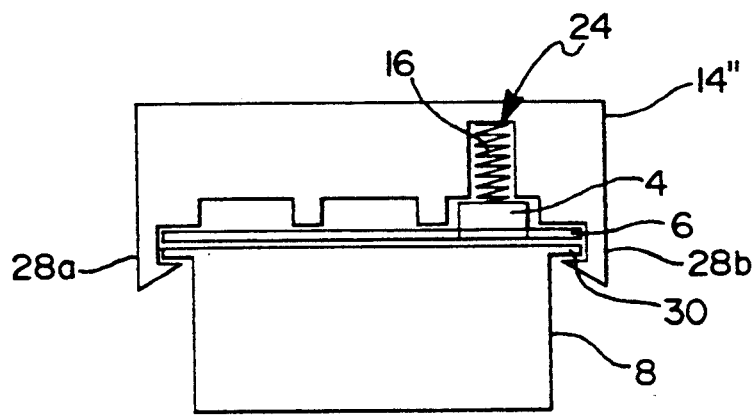
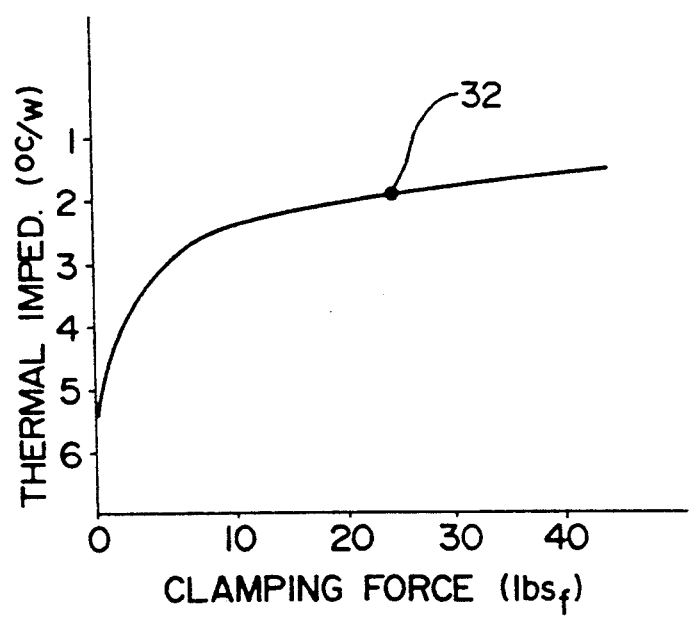
FIG 5

HEAT SINK MOUNTING SYSTEM FOR SEMICONDUCTOR DEVICES

FIELD OF THE INVENTION

The present invention relates to a method of mounting a semiconductor device to a heat sink. More particularly, the present invention relates to a method of mounting a semiconductor device to a heat sink through a circuit board opening using a clamping load to ensure a high level of thermoconductivity between the semiconductor device and the heat sink.

BACKGROUND OF THE INVENTION

Many semiconductor devices generate heat which, if not dissipated, can raise the temperature of the device sufficiently to damage it causing abnormal operation or complete failure. Therefore, it is common practice to attach the semiconductor device to some form of a heat dissipator, commonly known as a heat sink, which functions to absorb heat from the device and transfers the heat to the surrounding atmosphere.

Typically, a semiconductor device is furnished with a heat transmitting surface which can be attached by a mechanical fastener, such as a machine screw, to some form of a heat dissipator. The assembled semiconductor device and heat dissipator are then attached to a support, such as a printed circuit board, where the electrical leads emanating from the semiconductor device are attached, usually by soldering, to connection pads located on the printed circuit board. A mechanical fastener, such as a screw, is commonly used to attach the heat transmitting surface to the heat dissipator and has the advantage in that sufficient contact pressure can be created between the heat transmitting surface of the semiconductor device and the heat dissipator for good heat conduction therebetween. Disadvantages of using a mechanical fastener, such as a screw, includes both the cost of the screw, the time consuming assembly procedure required and the tight geometric tolerance that must be maintained if several devices are to be mounted in sequence.

For these reasons, heat dissipators have been suggested which resiliently grip the semiconductor device such as those disclosed in U.S. Pat. Nos. 4,509,839, 5,065,279, 4,933,746, 5,019,942, and 4,462,462 the disclosures of which are hereby incorporated by reference. These techniques eliminate the need for mechanical fasteners, such as screws, which require accurate alignment and time consuming assembly methods. However, each of these heat dissipators and the method used to secure the semiconductor device thereto is encumbered by one or more disadvantages which makes it less than ideal for its intended purpose. For example, heat dissipators illustrated and described in U.S. Pat. No. 4,012,769; 4,215,361; and 4,235,285 each resiliently grips the semiconductor device. However, none of these heat dissipators provide means for attaching the heat dissipator to a support such as a printed circuit board. U.S. Pat. No. 4,509,839 discloses a heat dissipator to which a semiconductor device is secured by means of a resilient clip. However, no provisions are disclosed for attachment of the heat dissipator to a printed circuit board and attachment of the electrical leads from the semiconductor device to the printed circuit board often cause failure from mechanically induced stress. Also, since the semiconductor must be electrically insulated from the heat dissipator, the bolt used to attach the semiconductor mounting tab must be insulated. This usually involves a time consuming assembly operation with tight tolerances and tedious methods due to a large number of components.

SUMMARY OF THE INVENTION

The present invention discloses a means of mounting a semiconductor device to a heat dissipator with a relatively high clamping load introduced by the use of a spring or other vertical force generating device where a circuit board is clamped between a retaining block and the heat dissipator and has an opening sized to allow the semiconductor device to pass through. The heat transfer is maximized from the semiconductor device to the heat dissipator by introducing a clamping load on the semiconductor device which extends over a wide dimensional range as compared to the prior art screw fastener method forcing the heat transmitting surface of the semiconductor toward the heat dissipator.

The present invention reduces the handling of small hardware such as flat and lock washers, insulators, and small screws. Also, if tapped holes or thread forming screws are used in the heat sink, by using the present invention the burr produced in the tapping or thread forming operations will not be in direct contact with the semiconductor since the tapped hole is relocated to an area lying outside rather than directly under the device, thus eliminating possible electrical short circuits.

Tight tolerancing that is often a requirement for multiple transistor mounting can be relaxed by use of the present invention. As a consequence, gravity feed manufacturing can be used for high volume production. The semiconductor devices can be positioned and soldered to the printed circuit board without the attachment of the heat sink device which can be installed in a later production operation.

One provision of the present invention is to mount a semiconductor device to a heat dissipator using a spring to provide a clamping load over a wide dimensional range.

Another provision of the present invention is to provide a method of mounting a semiconductor device to a heat dissipator where the printed circuit board is trapped between a retaining block and the heat dissipator.

Another provision of the present invention is to provide a method of mounting a semiconductor device to a heat dissipator where the semiconductor device is located in an opening in the printed circuit board so that the semiconductor device electrical leads can be soldered to the printed circuit board with a vertical load generating device such as a spring located on one side of the device and the heat dissipator located on the opposite side of the device.

Still another provision of the present invention is to provide a method of mounting a semiconductor device to a heat dissipator where a portion of the printed circuit board is cut out so that the semiconductor device passes therethrough allowing the printed circuit board to be trapped between a retaining block and on the opposite side the heat dissipator.

BRIEF DESCRIPTION OF THE DRAWINGS

FIG. 4 is a sectional view of an alternate embodiment of the present invention showing a retaining block having end clips which engage the heat sink; and FIG. 5 is a graph showing the relationship between clamping load and thermal impedance.

DESCRIPTION OF THE PREFERRED EMBODIMENT

Figure 1:
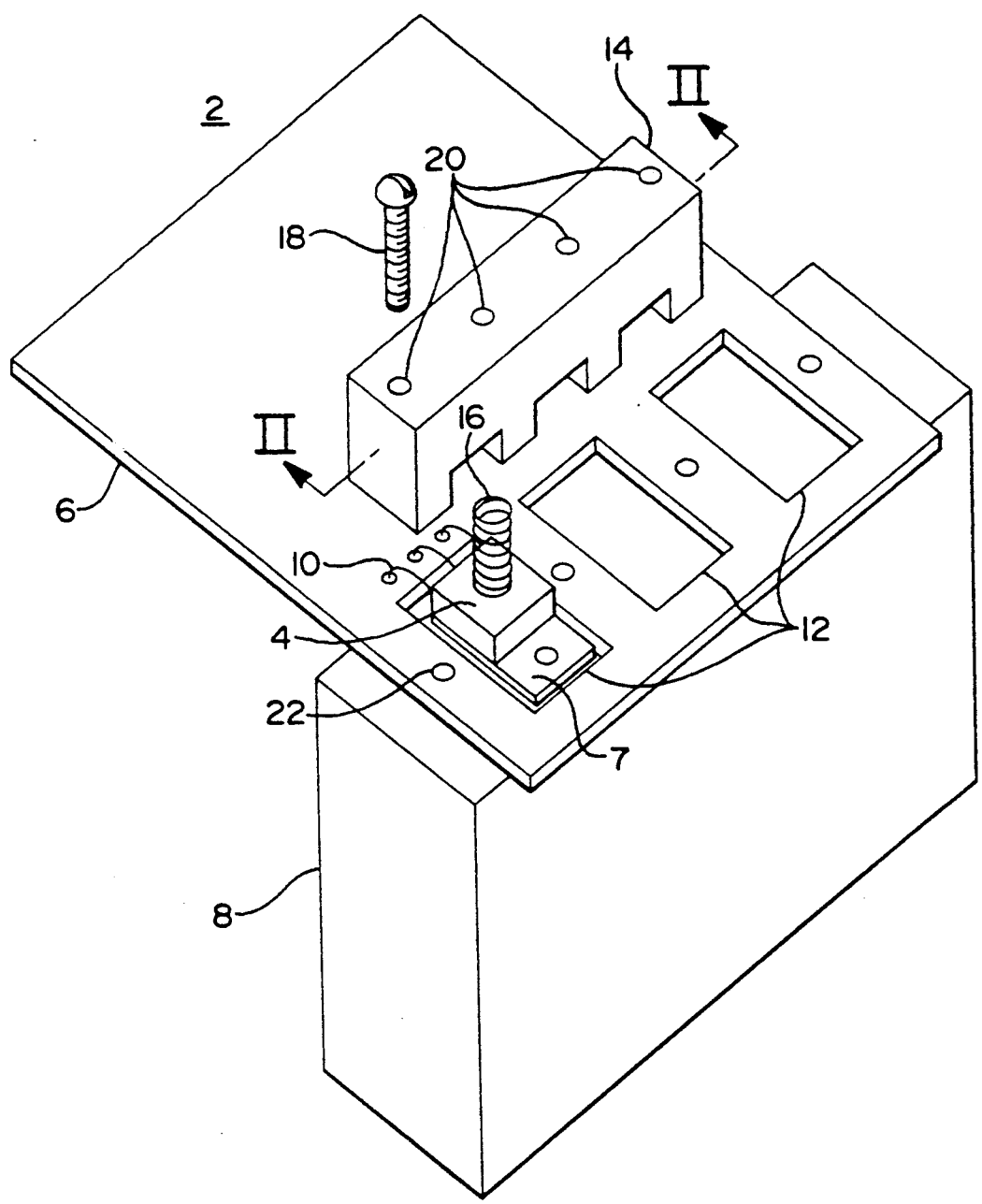
FIG. 1 is a perspective view of one embodiment of a semiconductor device mounted to a heat dissipator according to the present invention.

Now referring to FIG. 1, a semiconductor device mounting system 2 is shown where a semiconductor device 4 which produces high temperatures when in operation is mounted within a board opening 12 formed in a printed circuit board 6 where the heat transmitting surface 7 of the semiconductor device is in direct contact with a thin thermally conductive mounting pad (not shown) which acts as an electrical insulator which contacts and conducts heat to a heat dissipator such as a heat sink 8 which is commonly made out of a high thermal conductivity material such as aluminum and acts to dissipate excess heat into the surrounding air or into a cooling fluid. The thermally conductive electrical insulator (thermal pad) is commonly a thin sheet of silicone filled with a heat conducting material such as aluminum oxide.

There semiconductor devices 4 are shown in FIG. 1, although any number of devices can be mounted sequentially in a similar manner using the method of the present invention.

The semiconductor device 4 commonly has a plurality of electrical connection leads 10 which are electrically and mechanically attached to the printed circuit board 6 by soldering to connection pads. The connection pads are then electrically connected to the devices (not shown) located on the printed circuit board 6.

The circuit board openings 12 are formed so as to allow the semiconductor device 4 to pass therethrough and come in contact with the heat sink 8 via the thermal pad. A retaining block 14 is used to retain and locate a load spring 16 such that the load spring 16 is compressed when the retaining block is bolted to the heat sink 8 by engaging a plurality of threaded holes in the heat sink 8. The holding bolts 18 pass through a corresponding number of mounting bolt holes 20 in the retaining block 14 extending therethrough and engaging and threading into the heat sink 8. The circuit board 6 is clamped and held between the retaining block 14 and the heat sink 8.

The load springs 16 which are shown as coil springs, but can be any type of spring, are compressed when the retaining block 14 is attached using the holding bolts 18 or any other type of fastener and introduces a load against each respective semiconductor device 4 which is forced against the heat sink 8 thereby permitting maximum heat transfer through the heat transmitting surface 7 through the thermally conductive electrical insulator and into the heat sink 8. Other types of springs could be used such as a flat metal spring. Any load generating means to introduce a clamping force to produce a high contact pressure between the semiconductor device heat transmitting surface 7 and the heat sink 8 can be used.

Figure 2:
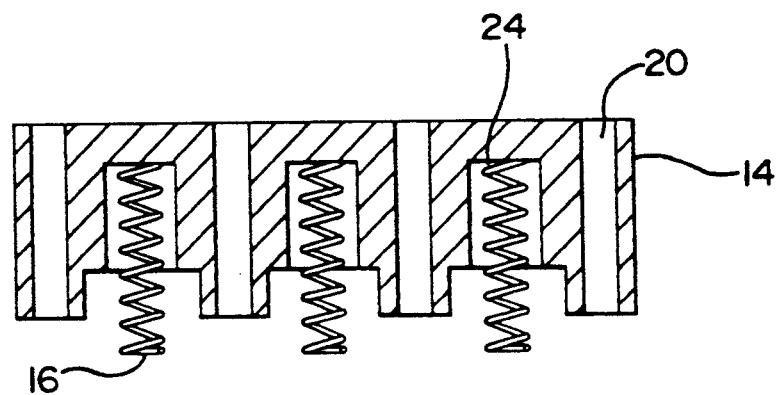
FIG. 2 is a sectional view of the mounting system for a semiconductor device of the present invention taken along line II—II.

FIG. 2 is a sectional view of the retaining block 14 taken along line II—II shown in FIG. 1. FIG. 2 shows a plurality of load springs 16 where spring pockets 24 are formed into the retaining block 14 allowing the load springs 16 to be located therein. Also shown is the mounting bolt holes 20 which allow the mounting bolts 18 to pass through and then through the board mounting holes 22 and then thread into tapped holes in the heat sink 8.

The heat sink 8 can be a variety of geometries and can consist of fins which extend from the area where the printed circuit board is mounted. The heat sink 8 can also be cooled with the introduction of a forced flow liquid, such as water, which is well known in the art.

The retaining block 14 can be made of a material such as a plastic which is easily molded and/or machined to include the spring pockets 24 and the mounting bolt holes 20. In the alternative, a metal material could be used for increased strength and some additional heat transfer. The load springs 16 are made of a spring steel and are selected to provide the desired clamping load of the semiconductor device 4 to the heat sink 8 via the thermal pad by selecting the length and diameter of the spring coils depending on the specific geometry of the semiconductor device 4, the depth of the spring pockets 24 relative to the surface of the circuit board 6 and the overall diameter of the load spring 16.

Using the mounting methods disclosed in the present invention, high clamping loads can be attained to force the semiconductor device 4 against the heat sink 8 via the thermal pad for improved thermal transfer and improved cooling. The semiconductor device 4 to be cooled is commonly a commercially available surface mount device such as a field effect transistor.

Figure 3:
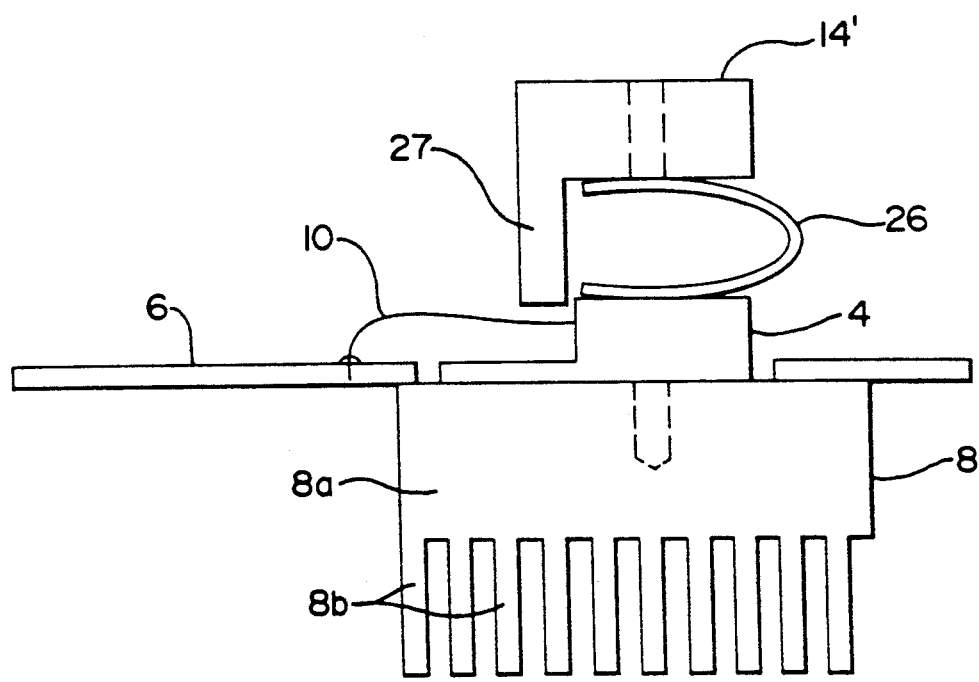
FIG. 3 is a sectional view of an alternate embodiment of the present invention showing a flat load spring.

FIG. 3 discloses an alternate embodiment of the present invention where the coil spring used for the load spring 16 has been replaced with a flat spring 26 which is bent into a U-shape where, upon installation of the retaining block 14', the flat spring 26 is compressed against the semiconductor device 4 thereby providing a force on the semiconductor device 4 clamping it against the heat sink 8 via the thermal pad which acts as a heat dissipator. The retaining block 14' has been altered to include an extended section 27 that retains the flat spring 26 in the proper position over the semiconductor device 4. The retaining block 14' is secured in position and compressed using a plurality of mounting bolts 18 threaded into the heat sink 8. The heat sink 8 is shown consisting of a plurality of fins 8b emanating from a heat sink main section 8a for improved heat transfer into the surrounding air.

FIG. 4 shows an alternate embodiment of the retaining block 14" where the retaining block 14 or 14' is modified at each end to include end clips 28a and 28b which engage a flange portion 30 on the heat sink 8 thereby compressing load springs 16 in a fashion similar to that shown in FIG. 1. This alternate embodiment allows for manufacture with an ease of assembly not allowed when a plurality of holding bolts 18 are threaded into the heat sink 8.

Again, similar to FIGS. 1 and 2 the printed circuit board 6 has a board opening 12 for each semiconductor device 4 formed so that the semiconductor device 4 passes through the circuit board 6 and comes in direct contact with the clamping load and through the thermally conductive electrical insulator (thermal pad) to the heat sink 8 with the circuit board 6 positioned between the retaining block 14 and the heat sink 8.

FIG. 5 is a graphical representation of the relationship between the clamping force and the thermal impedance of the interface between the heat transmitting surface 7 of the semiconductor device 4 and the heat sink 8 through the thermal pad. The desired clamping force of approximately 25 pounds-force (lbsf), shown as point 32, can be produced using the techniques of the present invention by selecting the proper spring rate and overall spring height. As shown in FIG. 5, the thermal impedance (degrees centigrade per watt) decreases rapidly, allowing for improved heat transfer between the semiconductor device 4 and the heat sink 8 as the clamping force is increased from zero to 10 lbsf. A force exceeding 30 lbsf does not greatly decrease the thermal impedance.

Using the present invention, a multiplicity of semiconductor devices 4 passing through a like number of open sections in a circuit board can be attached and mounted with an ideal level of clamping force to a heat sink 8 with minimal components and relaxed geometric tolerances.

It will be appreciated by those of ordinary skill in the art that many variations in the foregoing preferred embodiments are possible while remaining within the scope of the present invention. The present invention should thus not be considered limited in the preferred embodiments or the specific choices of materials, configurations, dimensions, applications or ranges of parameters employed therein.

What is claimed is:

1. A heat sink mounting system for a semiconductor device comprising:
   heat sink means having a plurality of fins emanating from a main section of said heat sink where said main section contacts a semiconductor device;
   coil spring for applying a loading force to said semiconductor device forcing said semiconductor device against said main body of said heat sink, said coil spring having a first and a second end where said first end contacts said semiconductor device;
   a circuit board having an opening allowing said semiconductor device to pass therethrough;
   a retaining block attached to said main body of said heat sink using a plurality of threaded fasteners where said circuit board is clamped between said retaining block and said heat sink, said retaining block having a pocket for capturing said second end of said coil spring and having two legs extending on opposed sides of said pocket and contacting said circuit board, said legs each having a hole therein for passage of one of said threaded fasteners.

2. The heat sink mounting system of claim 1, wherein said legs are sized to compress said coil spring a sufficient distance to create a desired force on said semiconductor device.

3. The heat sink mounting system of claim 2, wherein said coil spring imposes a clamping force of approximately 20 to 35 pounds on said semiconductor device.

4. The heat sink mounting system of claim 1, further comprising a plurality of said coil springs contacting a like number of said semiconductor devices at said first ends, said retaining block having a like number of pockets to contain said second ends of said coil springs where said pockets are collinear with each of said legs disposed between each pair of legs.

5. A heat sink mounting system for a semiconductor device comprising:
   heat sink means having a plurality of fins emanating from a main section of said heat sink where said main section contacts a semiconductor device;
   a leaf spring having a first side and a second side and a first end and a second end partially folded at approximately a centerline such that said first end and said second end of said first side are directly opposed, said leaf spring applying a force to said semiconductor device thereby forcing said semiconductor device against said main body of said heat sink, said first side of said leaf spring contacting and said first end contacting said semiconductor device;
   a retaining block attached to said main body of said heat sink using a plurality of threaded fasteners where said circuit board is clamped between said retaining block and said heat sink, said retaining block having an extended section extending toward said circuit board having a surface approximately parallel to a line extending from said first end to said second end of said leaf spring, said retaining block having two legs extending on opposed sides of said leaf spring and contacting said circuit board, said legs each having a hole formed therein for passage of one of said threaded fasteners.

6. The heat sink mounting system of claim 5, wherein said leaf spring is oriented such that said first side is directed toward said extended section.

7. The heat sink mounting system of claim 5, further comprising a plurality of said leaf springs contacting a like number of semiconductor devices at said first ends;
   said retaining block having a number of legs equivalent to the number of said leaf springs plus one, where each of said legs is disposed between each of said leaf springs.

8. The heat sink mounting system of claim 5, wherein said leaf spring imposes a clamping force of approximately 20 to 35 pounds on said semiconductor devices.

* * * * *